Sept. 18, 1956 E. J. H. BUSSARD ET AL 2,763,776

ULTRAHIGH-FREQUENCY CONVERTER FOR VERY-HIGH-FREQUENCY TELEVISION RECEIVER

Filed Oct. 18, 1951 9 Sheets-Sheet 1

INVENTORS.
EMMERY J. H. BUSSARD.
REUBEN NATHAN.
BY Alden D. Redfield
Charles M. Hogan
ATTORNEYS.

INVENTORS.
EMMERY J. H. BUSSARD.
REUBEN NATHAN.
BY
Alden D. Redfield
Charles M. Hogan.
ATTORNEYS.

Sept. 18, 1956

E. J. H. BUSSARD ET AL

ULTRAHIGH-FREQUENCY CONVERTER FOR VERY-HIGH-FREQUENCY TELEVISION RECEIVER 2,763,776

Filed Oct. 18, 1951

9 Sheets-Sheet 3

INVENTORS.

EMMERY J. H. BUSSARD

REUBEN NATHAN

BY Alden D. Redfield

Charles M. Hogan

ATTORNEYS.

INVENTORS.
EMMERY J. H. BUSSARD
REUBEN NATHAN
BY Alden D. Redfield
Charles M. Hogan
ATTORNEYS.

Sept. 18, 1956 E. J. H. BUSSARD ET AL 2,763,776

ULTRAHIGH-FREQUENCY CONVERTER FOR VERY-HIGH-FREQUENCY TELEVISION RECEIVER

Filed Oct. 18, 1951 9 Sheets-Sheet 5

INVENTORS.
EMMERY J. H. BUSSARD.
REUBEN NATHAN.
BY Alden D. Redfield
Charles M. Hogan
ATTORNEYS.

INVENTORS.
EMMERY J. H. BUSSARD.
REUBEN NATHAN.
BY Alden D. Redfield
Charles M. Hogan.
ATTORNEYS.

Sept. 18, 1956

E. J. H. BUSSARD ET AL
ULTRAHIGH-FREQUENCY CONVERTER
FOR VERY-HIGH-FREQUENCY
TELEVISION RECEIVER 2,763,776

Filed Oct. 18, 1951

9 Sheets-Sheet 7

INVENTORS
EMMERY J. H. BUSSARD.
REUBEN NATHAN.
BY Alden D. Redfield
Charles M. Hogan.
ATTORNEYS.

INVENTORS.
EMMERY J. H. BUSSARD
REUBEN NATHAN
BY Alden D. Redfield
Charles M. Hogan
ATTORNEYS.

INVENTORS.
EMMERY J. H. BUSSARD.
BY REUBEN NATHAN.
Alden D. Redfield
Charles M. Hogan.
ATTORNEYS.

United States Patent Office 2,763,776

Patented Sept. 18, 1956

2,763,776

ULTRAHIGH-FREQUENCY CONVERTER FOR VERY-HIGH-FREQUENCY TELEVISION RECEIVER

Emmery J. H. Bussard and Reuben Nathan, Cincinnati, Ohio, assignors to Avco Manufacturing Corporation, Cincinnati, Ohio, a corporation of Delaware Application October 18, 1951, Serial No. 251,864

5 Claims. (Cl. 250—20)

The present invention relates to ultra-high-frequency (U. H. F.) converters for television receivers. A U. H. F. converter is a device which selects the radio frequency carrier signals in the desired U. H. F. channel, converts them into first intermediate frequency (I. F.) carrier signals in the very-high-frequency (V. H. F.) range, and then applies the first I. F. output signals to the V. H. F. signal input circuit of a television receiver tuner. A V. H. F. tuner is a unit included in the receiver, comprising preselector circuits, a local oscillator and a mixer functioning cooperatively to select carrier frequency signals in the desired V. H. F. channel, to convert them into intermediate frequency signals (referred to as "second I. F. signals" when a converter is used), and to apply those I. F. signals to the conventional intermediate frequency amplifier stages of the receiver. When a U. H. F. converter is used in conjunction with a V. H. F. tuner the selector circuits of the V. H. F. tuner are adjusted to receive the V. H. F. signal output of the converter, and the receiver and converter function together as a double superheterodyne receiver. Subject matter disclosed but not claimed herein is disclosed and claimed in United States patent application of Emmery J. H. Bussard and Reuben Nathan, Serial No. 319,622, filed October 29, 1952, and in a divisional application of the latter, both assigned to the same assignee as the present application and invention. Such divisional application bears Serial No. 406,034 and was filed on December 15, 1953.

In the illustrative U. H. F. converter herein shown, the frequency of the local oscillator is lower than the frequency of the U. H. F. signal input to the converter, this tuner being intended for use with a receiver having a non-symmetrical intermediate frequency system and a local oscillator operating at higher frequencies than that of the V. H. F. input to the receiver proper. Provision is made in this manner for correct presentation of signals to the intermediate frequency system included in the receiver. In the alternative, when a converter is employed with a receiver in which the local oscillator frequency is lower than the frequencies of the V. H. F. input to the receiver, then the frequency of the local oscillator included in the converter should be made higher than that of the U. H. F. signal input to the converter.

At the present time channels Nos. 2 through 13 are available in the United States for commercial video broadcasting, with V. H. F. channel frequency allocations as follows:

| Channel No. | Megacycles |
|---|---|
| 2 | 54–60 |
| 3 | 60–66 |
| 4 | 66–72 |
| 5 | 76–82 |
| 6 | 82–88 |
| 7 | 174–180 |
| 8 | 180–186 |
| 9 | 186–192 |
| 10 | 192–198 |
| 11 | 198–204 |
| 12 | 204–210 |
| 13 | 210–216 |

The complete V. H. F. range comprises a lower V. H. F. band (54–88 megacycles) and an upper V. H. F. band (174–216 megacycles). In the preferred embodiment of the present invention, this factor is exploited to great advantage, the first I. F. output signal frequencies of the converter being in the portion of the spectrum between those two bands. This portion is not used at any place in the United States for video broadcasting.

The present invention generically embraces, but is not specifically limited to, a converter having a V. H. F. signal output frequency within one of the present V. H. F. channels. A converter which is so limited is designed for a very wide bandwidth to provide output I. F. frequencies covering two adjacent V. H. F. channels, so that an alternate channel may be used for U. H. F. reception if the other V. H. F. channel is assigned to the location where the converter is installed. Prior art converters which provide a V. H. F. signal output frequency within the present V. H. F. channels are subject to a further limitation, even when designed to provide output frequencies covering two adjacent V. H. F. channels, because they do not operate in a satisfactory manner in areas wherein both channels are used for V. H. F. reception. Prior art tuners of this character may be tuned to provide output frequencies within either of two present V. H. F. channels. The present invention affords a very significant advantage in that a V. H. F. selector used in conjunction with our novel converter may be adjusted to receive I. F. signals at any point within the receiver pass band, and such selector is not limited to two positions.

The preferred embodiment of the present invention has a narrower bandwidth and is advantageously used with a continuous type of V. H. F. tuner, the output I. F. frequencies being in the portion of the spectrum between the V. H. F. bands, the portion being covered by continuous V. H. F. tuners but not by step-by-step tuners. It is, accordingly, an object of the preferred form of the invention to provide:

First, a converter having a narrower output bandwith;

Second, a converter which can universally be used with continuous tuners;

Third, a converter which provides output carrier signals in the portion of the spectrum between the V. H. F. bands;

Fourth, a converter which does not require a range of output frequencies covering two adjacent V. H. F. frequencies; and Fifth, a converter having enhanced gain, signal-to-noise ratio and selectivity characteristics.

The Federal Communications Commission presently contemplates the allocation of carrier frequencies from 470 to 890 megacycles to television broadcast transmission and proposes to add to the present V. H. F. channels a total of 70 additional channels, Nos. 14 through 83, comprising the U. H. F. band or range. Upon the completion and final adoption of this allocation plan or a similar proposal, commercially successful television receivers will require:

A combined U. H. F.—V. H. F. tuner for the selection of any one of the very large number of channels within the U. H. F. and V. H. F. ranges, or A U. H. F. converter in combination with a V. H. F. receiver.

U. H. F. converters will then be required in large numbers to adapt V. H. F. receivers to U. H. F. reception. The preferred type of converter in accordance with the invention will have V. H. F. output frequencies between the V. H. F. bands. Other converters, including a modified form in accordance with the invention, will have V. H. F. output frequencies in one of the present V. H. F. channels.

Other important objects of the invention are to provide:

First, a continuously tuned U. H. F. converter for V. H. F. television receivers, specifically a continuously variable tuned U. H. F. converter which is particularly effective in adapting certain makes of existing V. H. F. receivers to U. H. F. reception;

Second, a converter requiring a minimum of circuit alignments;

Third, a converter characterized by high attenuation of and discrimination against undesired signals and spurious responses;

Fourth, a U. H. F. converter having such a low noise characteristic that voltage amplification is obtained at frequencies which simplify design;

Fifth, a converter which exploits the advantages of U. H. F. tuning lines;

Sixth, a converter which features simple antenna and preselector couplings, affording uniform bandpass and efficient power transfer;

Seventh, a converter of economical, compact construction;

Eighth, a converter which may readily and with facility be added to a V. H. F. television installation;

Ninth, a converter which features novel double-tuned bandpass selector and local oscillator circuits;

Tenth, a converter which minimizes oscillator radiation;

Eleventh, a converter with a good output signal-to-noise ratio;

Twelfth, a converter which produces output signals on the order of 127.5 megacycles, the practical ideal value;

Thirteenth, a converter which may have a relatively narrow bandpass;

Fourteenth, a converter having selector circuits which are easily ganged and adjusted for tracking;

Fifteenth, a converter in which a single control element provides both gross and fine adjustments;

Sixteenth, a converter including a control switch selectively operable to condition the receiver-converter combination for either U. H. F. or V. H. F. reception;

Seventeenth, a converter having a response characteristic of proper symmetry with respect to the center frequency of the channel, for any one of the large number of proposed U. H. F. channels;

Eighteenth, a self-powered converter with means for controlling the power supply to the receiver;

Nineteenth, a converter with antenna switching means for selecting either the V. H. F. antenna or the U. H. F. antenna, as desired;

Twentieth, a well-shielded converter construction;

Twenty-first, a converter construction which can be readily and conveniently serviced in the field;

Twenty-second, a converter including an oscillator having a novel and particularly stable bridge type feedback system;

Twenty-third, a converter having uniform mixer excitation from the local oscillator.

For a better understanding of the invention, together with other and further objects, advantages, and capabilities thereof, reference is made to the following description of the accompanying drawings, in which there is shown a complete U. H. F. converter in accordance with the invention:

Fig. 1 is a top plan view of a complete U. H. F. television converter in accordance with the invention;

Figure 1:
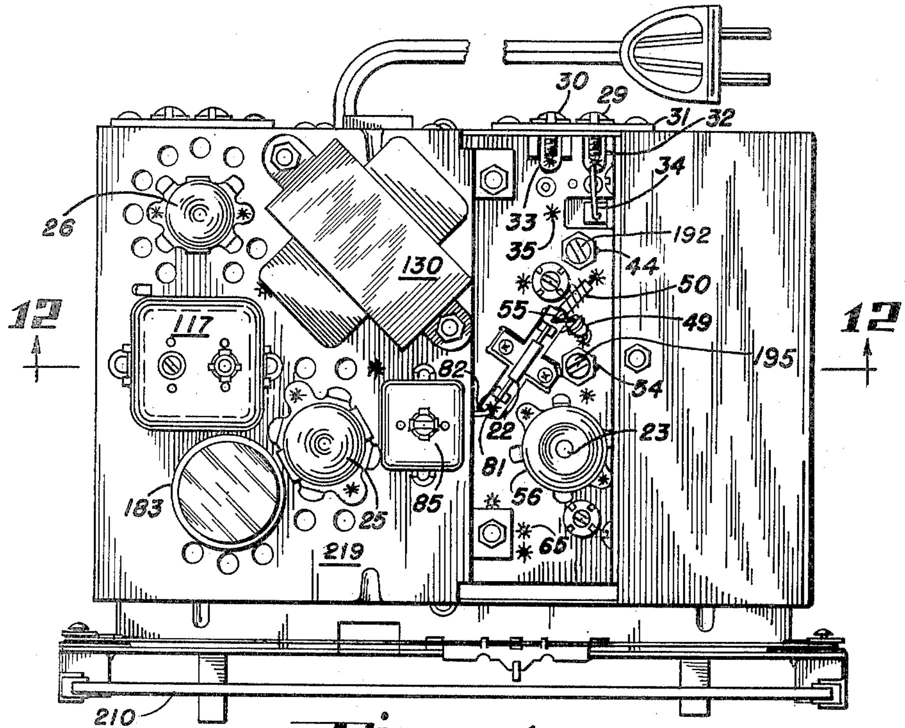
Figure 3:
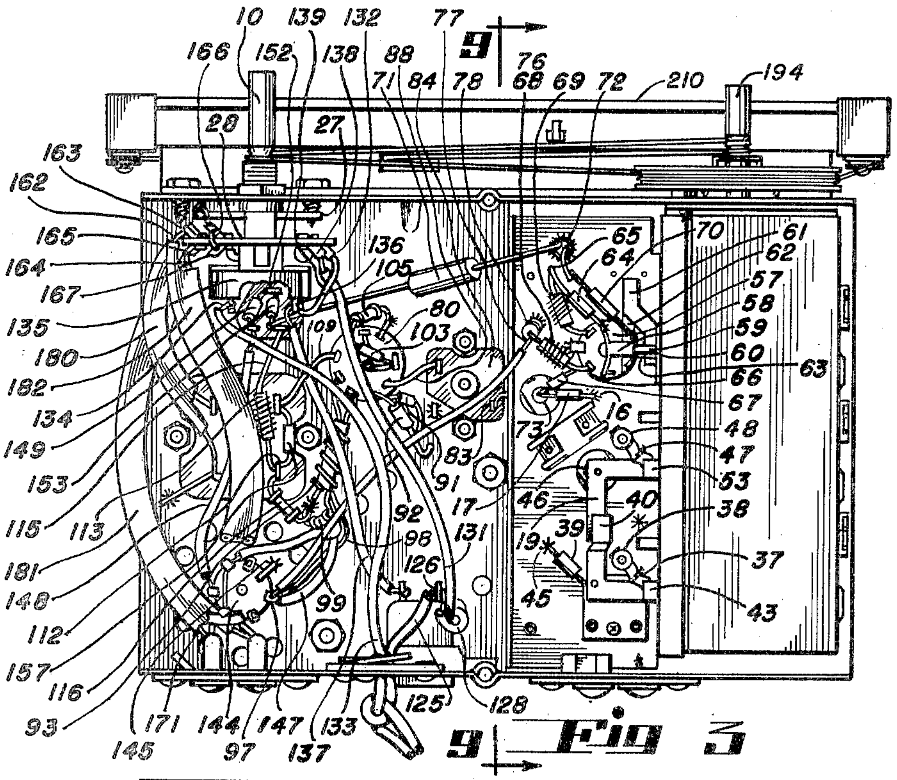
Fig. 3 is a bottom view of the converter, showing the locations of most of the circuit components, the front portion of the converter being at the top of the view.
Figure 7:
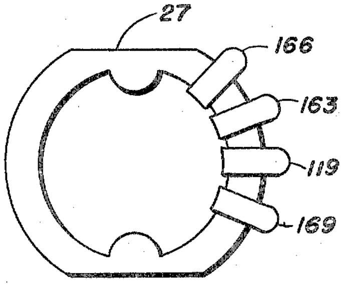
Figure 8:
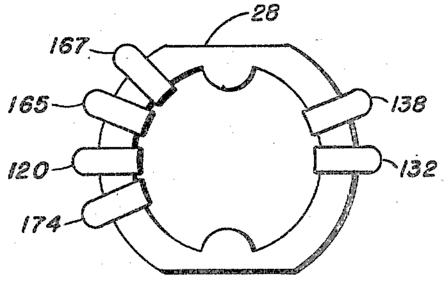
Figure 9:
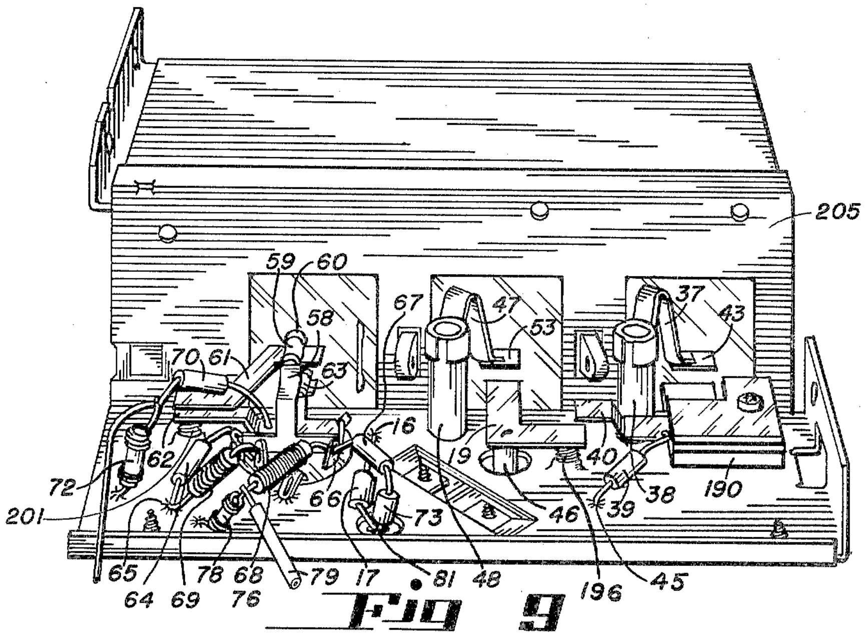
Figure 10:
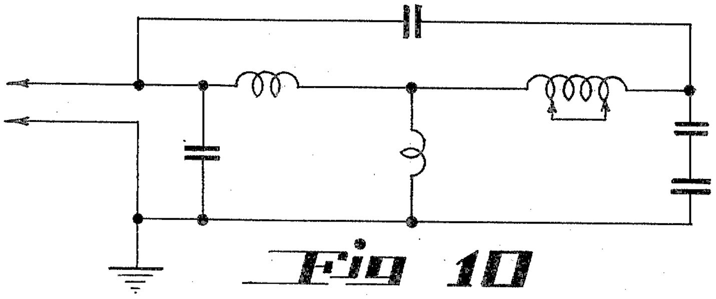
Figure 11:
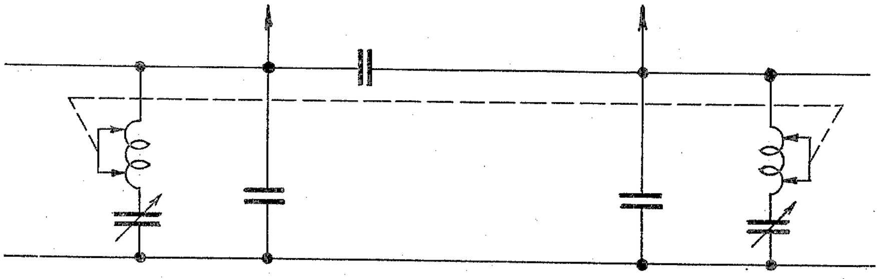
Figure 12:
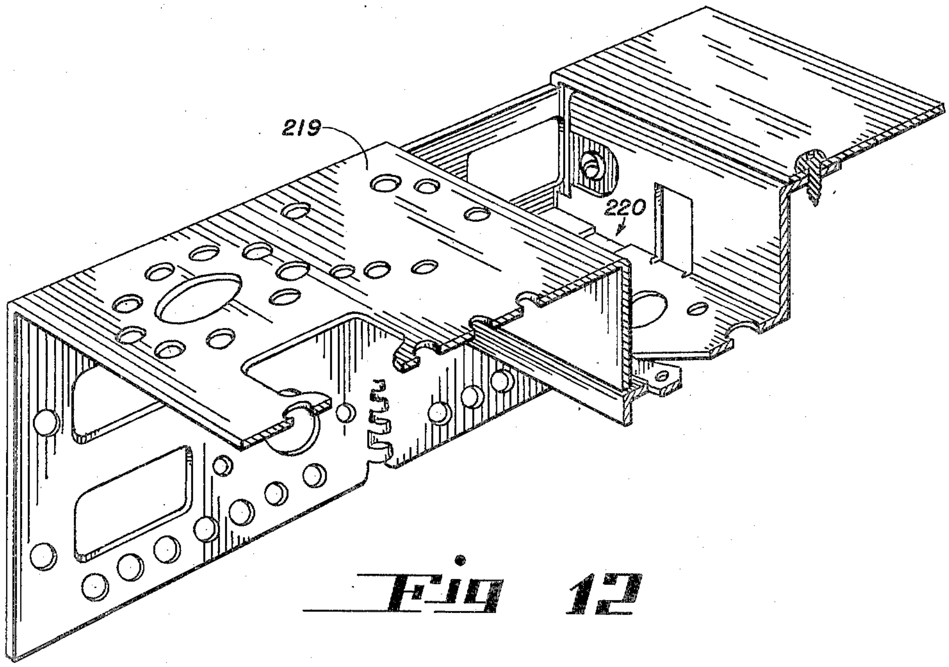
Figure 13:
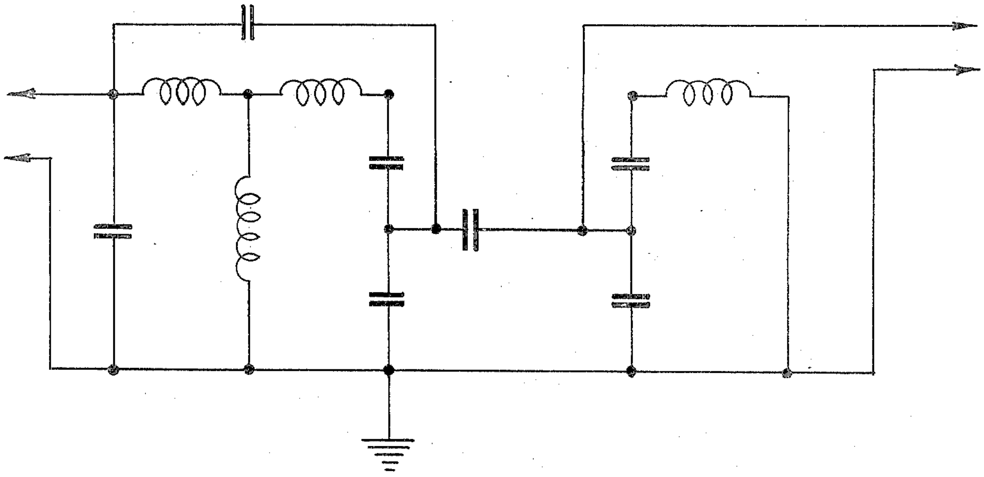
Figures 14, 15, 16, 17:
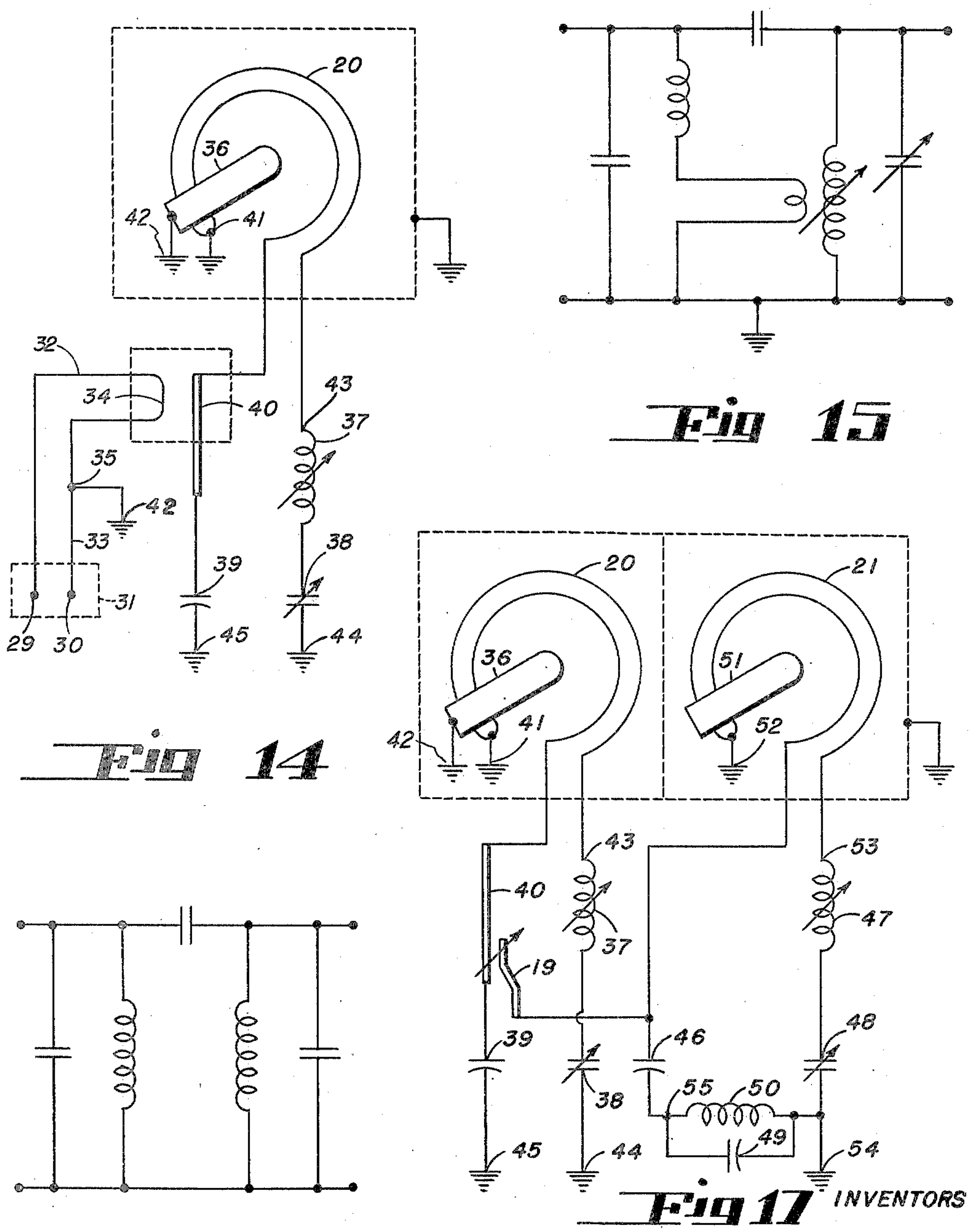
Figure 18:
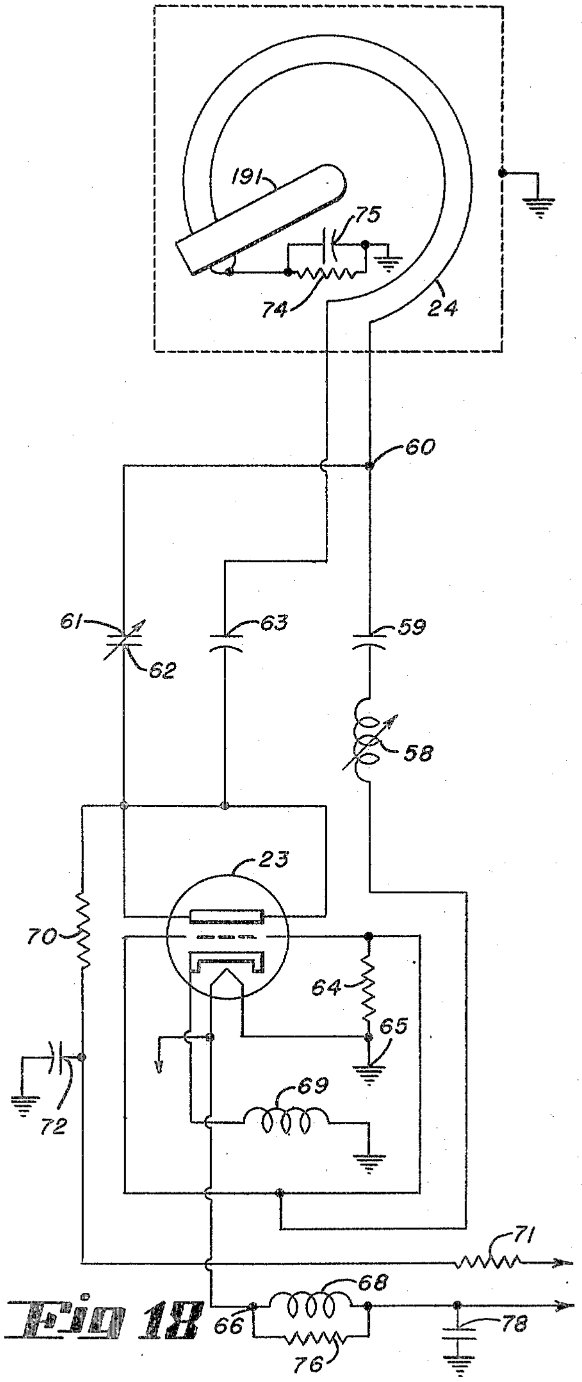
Figure 19:
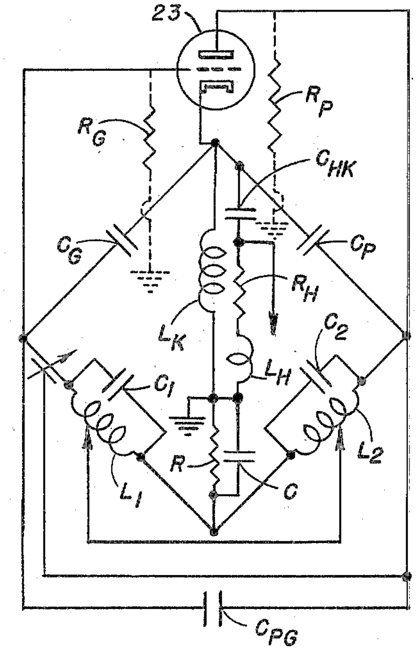
Figure 20:
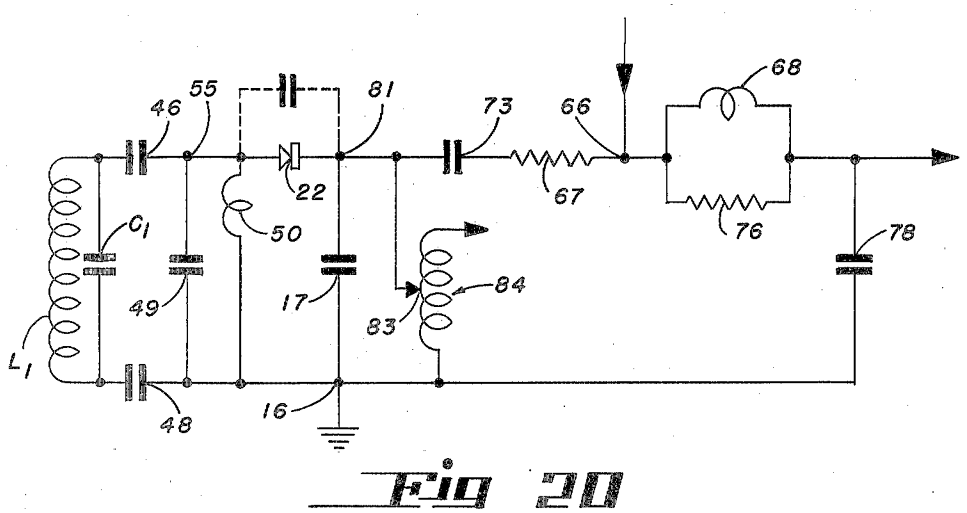
Figure 21:
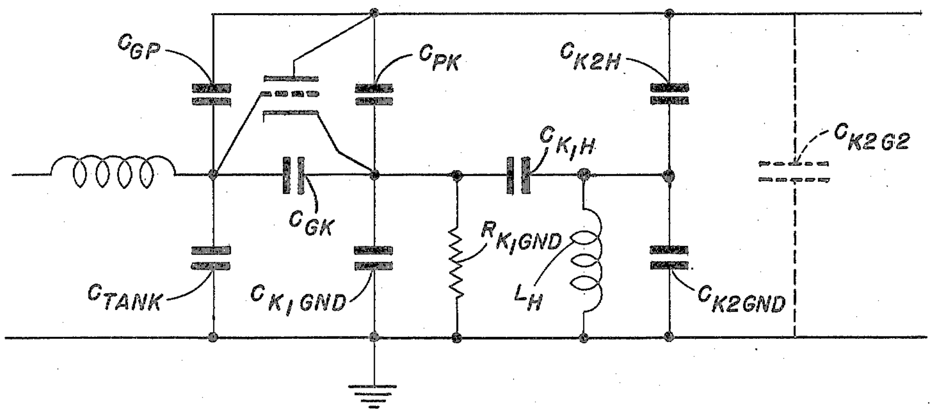

Figs. 7 and 8 are symbolic illustrative outlines showing the layouts of the contacts on switches 27 and 28;

Fig. 9 is a fragmentary perspective view of the bottom of the higher-frequency portion of the converter chassis as seen by an observer looking to the right and toward the adjusting mechanism, from a point of observation located approximately centrally of Fig. 3, i. e., looking to the right from section line 9—9 of Fig. 3;

Figs. 10 and 15 are equivalent circuit diagrams used as aids in explaining the operation of the novel antenna coupling circuit included in the converter;

Figs. 11 and 16 are circuit equivalents used as aids in describing the operation of the complete preselector included in the converter;

Fig. 12 is a fragmentary view of the chassis member of the Fig. 1 embodiment, stripped down, the view being shown with the parts broken away approximately at the section line 12—12 of Fig. 1;

Fig. 13 is an electrical equivalent of the antenna input and preselector tuning line circuits and is used as an aid in describing their operation;

Fig. 14 is a schematic circuit diagram of the antenna coupling circuit included in the converter;

Fig. 17 is an electrical circuit diagram of the two tuning line circuits included in the preselector stage of the converter;

Fig. 18 is a circuit diagram of the novel oscillator included in the converter;

Fig. 19 is a circuit equivalent of that oscillator used as an aid in describing the operation thereof;

Fig. 20 is a circuit equivalent of the mixer circuit included in the converter and is supplied for purposes of exposition; and Fig. 21 is a circuit equivalent of the I. F. amplifier stage of the novel converter in accordance with the invention.

The novel converter unit in accordance with the invention (Fig. 5) comprises the following major units: First, a double-tuned bandpass preselector circuit comprising the tuning lines 20 and 21 and immediately associated components; second, a crystal mixer diode 22 to which the selected radio frequency carrier signals are applied; third, a local oscillator comprising vacuum tube 23, tuning line 24 and associated components for generating local oscillations which are also applied to the crystal mixer to convert, by heterodyne action, the carrier frequency signals into intermediate frequency signals; fourth, a low noise stage of first I. F. power amplification comprising a vacuum tube 25 and associated circuit elements; fifth, a power supply in the form of a half-wave rectifier inclusive of tube 26, functioning as a source of heater and space currents; and sixth, a ganged pair of control switches 27 and 28, manually operable to condition the receiver for ultra-high-frequency operation (U. H. F.) or very-high-frequency operation (V. H. F.).

Figure 4:
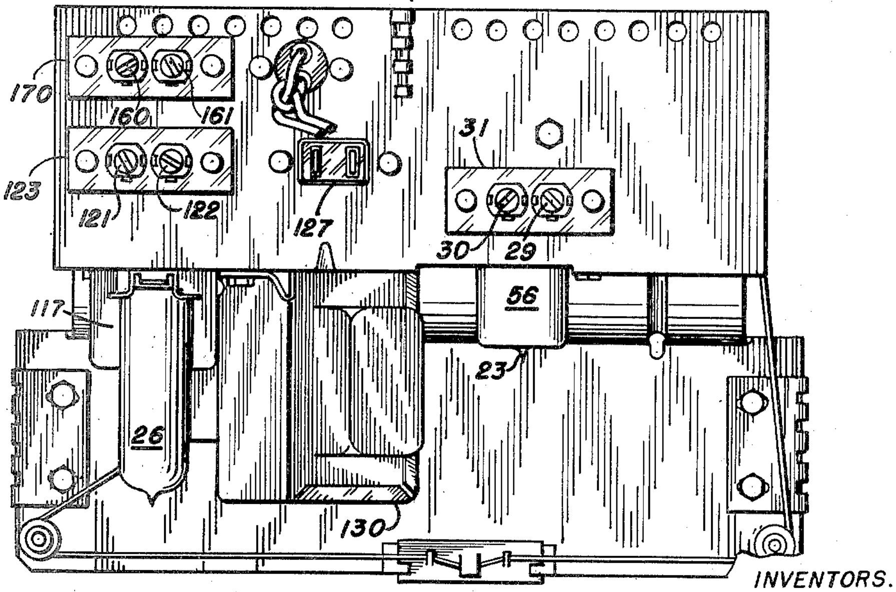
Fig. 4 is an inverted rear elevational view of the converter.
Figure 5:
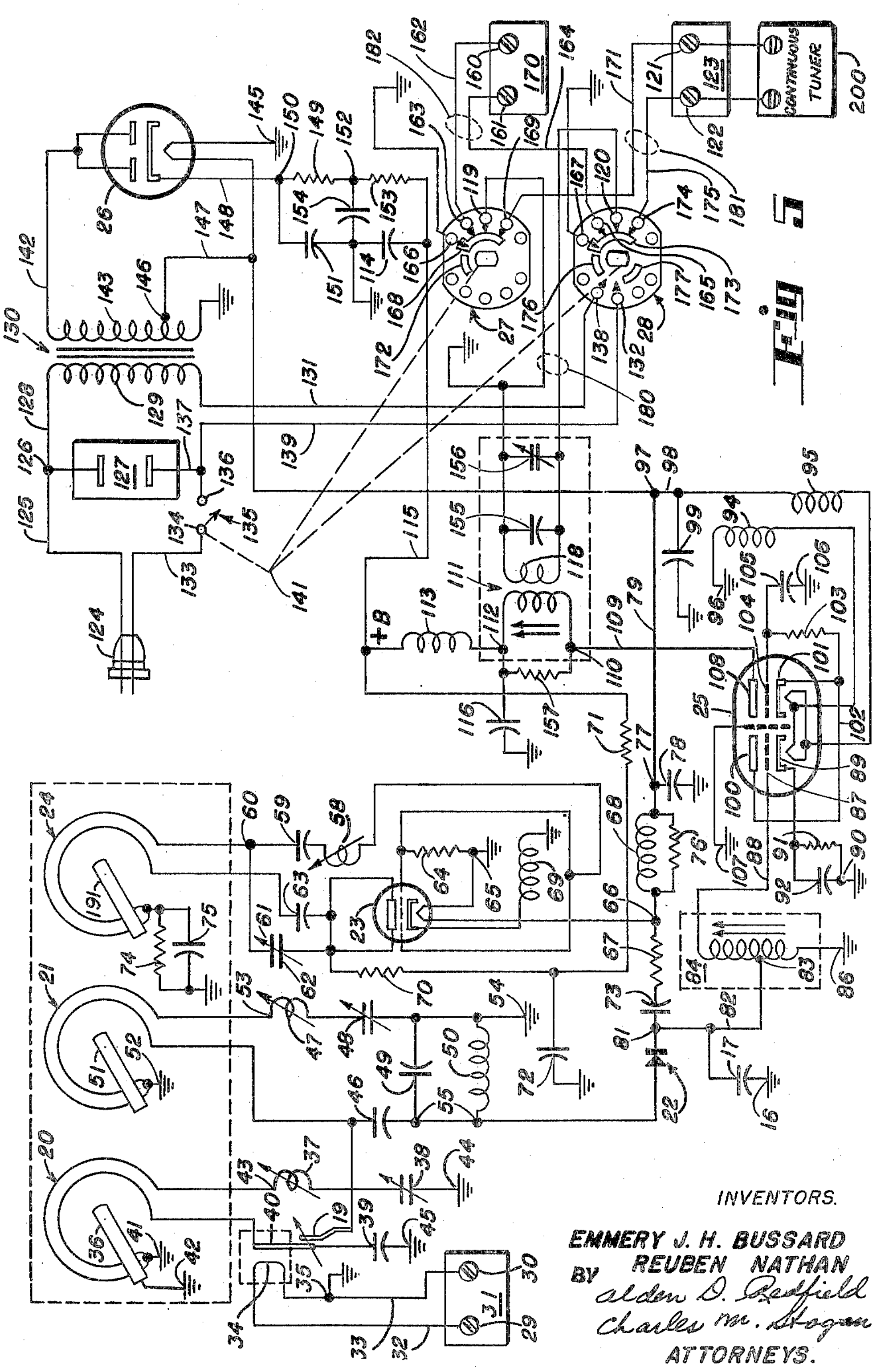
Fig. 5 is an electrical schematic of the circuits included in the converter.

A suitable U. H. F. antenna is connected to antenna input terminals 29 and 30 mounted on insulating board 31 (Figs. 1, 4, 5). These terminals are connected by conductors 32 and 33 to the primary of an antenna input transformer, which primary comprises a loop of conductive material 34, one terminal of which is grounded at 35. The first preselector circuit comprises a parallel-conductor type of tuning line 20 (Figs. 5, 6) which is adjusted by a short-circuiting bar, indicated by the reference numeral 36, to produce parallel resonant conditions in the tuned circuit comprising tuning line 20, end inductor 37, trimmer capacitor 38, capacitor 39, and metallic plate 40. Plate 40 is a ribbon conductor which serves both as an inductor and as the fixed plate of a capacitor, in furtherance of the two functions of antenna coupling and coupling between the two circuits of the selector network.

The closed end of transmission line 20 is grounded at 41, and the adjustable shorting bar is grounded at 42. One terminal of line 20 is connected to plate 40, and the other terminal is connected at point 43 to an adjustable end inductor 37 (Figs. 3, 5, 9). The remaining terminals of plate 40 and inductor 37 are connected, respectively, to the high potential terminals of capacitor 39 and capacitor 38. Capacitor 38 is adjustable and is connected to ground at 44 (Figs. 1, 5). The remaining terminal of capacitor 39 is grounded at 45 (Figs. 3, 9). The antenna input primary 34 is coupled to the first preselector circuit, inclusive of the elements 39, 40, 20, 37, and 38, by the capacitive and mutually inductive relationship existing between loop 34 and plate 40 (Fig. 5). Loop 34 and ribbon 40 are cast into a block of low-loss phenolic material 190 (Fig. 9), uniformly to provide the correct capacity and inductive coupling.

The bandpass selector network in accordance with the invention includes a second tuned preselector circuit comprising tuning line 21 and associated circuit elements 46, 47, 48, 49, and 50. Line 21 is provided with an adjustable shorting bar 51. The closed end of the tuning line is grounded at 52. One terminal of the tuning line is connected to a terminal of capacitor 46 (Figs. 3, 5, 9). The other terminal of tuning line 21 is connected at 53 to adjustable end inductor 47. Capacitor 48 is connected between grounded point 54 and the remaining terminal of inductor 47. Capacitor 46 projects through the chasssis and is connected to crystal 22 at junction 55 (Figs. 1, 5, 9). Inductance 50 (Figs. 1, 5) is connected between point 55 and ground, and capacitor 49 is also connected between point 55 and ground. Point 55 is the junction of crystal 22, capacitors 46 and 49, and inductance 50.

The first preselector circuit is coupled to the second preselector circuit by the capacitive and inductive, primarily the capacitive, relationships between plate 40 (Figs. 3, 5, 9) and plate 19, plate 19 being connected to the junction of capacitor 46 and tuning line 21 (Fig. 5).

The preselector circuit elements 34, 40, 39, 19, 37, 38, 46, 47, 48, 49 and 50 are mounted in the rear of a depressed portion of the chassis best shown in Figs. 1, 3, and 12. The depressed portion is referred to as an R. F. subchassis. The antenna circuit and preselector components illustrated in Fig. 1 are mounted on the top of the R. F. subchassis. The antenna circuit preselector components shown in Figs. 3 and 9 are mounted on the bottom of this subchassis.

The preselector output is taken from terminals 55 and 54 (ground), and the parallel combination of capacitor 49 and inductor 50 is connected across these terminals (Fig. 5).

The preselector circuitry between the antenna input terminals and the mixer 22 having been described in detail, the discussion now proceeds to the oscillator circuit shown in Fig. 5. The oscillator comprises a tube 23 which is placed in a shielding can 56 (Fig. 1). The oscillator tube is mounted on a socket 57 (Fig. 3). The two oscillator grid terminals are connected to one terminal of an adjustable end inductor 58, the remaining terminal of which is connected to a terminal of capacitor 59 (Figs. 3, 5, 9). The other terminal of capacitor 59 is connected to tuning line 24 at point 60, and the line is connected at this point to a plate 61 which is mounted in spaced relationship to another plate 62 to form an adjustable capacitor, plate 62 being connected to both oscillator tube anode terminals (Figs. 3 and 9). Disposed immediately above and adjacent capacitor 59 is a capacitor 63 which connects both anode terminals of tube 23 to the remaining terminal of the tuning line. A grid resistor 64 (Fig. 3) is connected between the grid terminal of tube 23 and grounded point 65. One of the heater terminals is grounded, and the other heater terminal is connected at 66 to the junction of a resistor 67 and an inductance 68. The cathode terminal is returned to ground through an inductance 69. The anode of oscillator tube 23 is connected to the space current supply source through serially related resistors 70 and 71, a filter capacitor 72 (Figs. 3, 5, 9) being connected between the junction of these two resistors and ground. The injection circuit between the oscillator and the mixer originates at the oscillator heater and is completed through resistor 67 and capacitor 73, the latter being connected between crystal 22 and resistor 67. Point 81 (Figs. 1 and 5) is the junction of crystal 22 and capacitor 73 (Figs. 1, 9, 5). A capacitor 17 is connected between point 81 and ground 16 (Figs. 3, 5, 9).

Between the closed end of tuning line 24 and ground is connected a parallel combination of resistance 74 and capacitance 75. The oscillator tuning line is provided with a shorting bar 191.

The oscillator heater circuit connections to the heater current supply are completed through the parallel combination of inductor 68 and resistor 76 to a terminal 77. Inductance 68 is mounted on resistor 76. A shunt capacitor 78 is connected between junction 77 and ground, conductor 79 thence leading to the filament current supply terminal 97.

The oscillator tube and circuit components are also mounted on the R. F. subchassis, as best shown in Figs. 1, 3, 9, and 12, generally near the front. The mixer 22, oscillator tube 23, capacitor 49, and inductor 50 are mounted on the top side (Fig. 1).

Referring now to the first intermediate frequency amplifier stage, tube 25 (Figs. 1, 5) is mounted on top of the main chassis in a socket 80 (Fig. 3). The input to this stage begins at the junction 81 of crystal 22 and capacitor 73. This junction point is connected by a conductor 82 to a tap 83 on a slug-tuned transformer 84 mounted in can 85. The high potential terminal of this transformer is connected to grid 87 of the twin triode 25 by a conductor 88. Cathode 89 is connected to grounded point 90 by a parallel combination of resistor 91 and capacitor 92 (Figs. 3, 5). The heater terminals are connected to leads of bifilar winding 93 comprising a winding 94 and a winding 95. The remaining lead of winding 94 is grounded at 96. The remaining lead of winding 95 is connected to the filament current supply terminal 97 by a conductor 98. Between that terminal and ground is connected a shunt capacitor 99. Junction point 97 is conductively connected to the heater of the power supply tube 26. Anode 100 is directly coupled to cathode 101 by a conductor 102. A grid resistor 103 is connected between grid 104 and cathode 101. The grid 104 of the cascode I. F. amplifier is grounded for high-frequency currents by capacitor 105, one terminal of which is connected to ground at 106. The tube internal shield is grounded at 107. The output terminal of the cascode I. F. amplifier is at the anode 108, which is connected by conductor 109 to terminal 110 of transformer 111. The remaining primary terminal 112 of this output transformer is connected to the space current source (+B) through an inductance 113, the connection being made to the power supply filter capacitor 114 and series filter resistor 153 by a conductor 115. In shunt with the primary of transformer 111 is a resistor 157 (Figs. 3 and 5). A capacitor 116 is connected between transformer primary terminal 112 and ground. Transformer 111 is contained in a shielded can 117 (Fig. 1). Shunted across secondary 118 is the parallel combination of capacitor 155 and trimmer capacitor 156, both located within shield 117. The signal output terminals 121 and 122 are mounted on a terminal strip 123 (Figs. 4 and 5).

Having described the selector circuitry, the frequency-changing circuitry, the intermediate frequency amplifier, and the signal output terminals, the discussion now proceeds to the power supply. There is provided a conventional plug 124 for insertion in a light socket in the household. One of the leads of this plug, numbered 125, is connected at 126 (Figs. 3 and 5) to a receptacle 127 and is also connected through a conductor 128 to the primary 129 of power transformer 130 (Figs. 1, 3, 4, 5). The remaining terminal of the power transformer primary is connected by a conductor 131 to the contact 138 of switch 28. The other supply lead 133 is connected to terminal 134 of "on-off" switch 135, the remaining terminal 136 (Fig. 3) of the "on-off" switch being connected to the receptacle 127 by a conductor 137 and also to contact 132 of switch 28 by conductor 139. It will be seen from an inspection of Fig. 5 that when switch 28 is moved two positions clockwise to the U. H. F. position, contact 177 closes the circuit between contacts 132 and 138, energizing the primary 129, completing the connections to the household power supply. The switches 27 and 28 are so ganged as to be controlled in unison and are so mechanically coupled to switch 135 by any suitable conventional means, indicated by the dashed line 141, that the on-off switch 135 is closed whenever the switches 27 and 28 illustrated in Fig. 5 are in the U. H. F. position (two positions clockwise from that shown) or the V. H. F. position (one position clockwise).

One of the leads 142 of power transformer secondary 143 is connected to the anodes of rectifier tube 26 mounted on socket 144 (Fig. 3) on the main chassis. One of the heater terminals of tube 26 is grounded at 145, and the other heater terminal is conductively connected to point 97 (Figs. 3 and 5). A tap 146 on the secondary is connected to terminal 97 by conductor 147 to provide an ungrounded filament supply terminal. The cathode of the rectifier tube is connected by a conductor 148 to the junction 150 of series filter resistor 149 and shunt filter capacitor 151. The remaining terminal of resistor 149 is connected at junction point 152 to series filter resistor 153. Shunt filter capacitors 114 and 154 are connected to the ends of resistor 153, and the remaining terminals of the three filter capacitors are grounded in a conventional manner. All of the filter capacitors 114, 151, and 154 are included in a capacitor can 183 (Fig. 1).

So far as the operation of this purely conventional half-wave rectifier is concerned, suffice it to say that it provides a heater voltage of the proper value between terminal 97 and ground and an anode voltage of the proper amount between conductor 115 and ground. The heater circuit is energized in a conventional manner by a low potential fraction of secondary 143.

It has been shown how the power pack primary is energized when the ganged switches 27 and 28 are set in the U. H. F. position. The relationship between these two switches and switch 135, effected by the ganging means 141, is such that the on-off switch 135 is closed when the switches 27 and 28 are set for either the U. H. F. position or the V. H. F. position. Accordingly, receptacle 127 is "hot" when this converter is set to either the U. H. F. or V. H. F. conditions of operation. In either event, the power plug for the receiver proper (not shown) provides energy for the receiver when plugged into receptacle 127. Thus it will be seen that the invention provides, in a U. H. F. converter of the type which is adapted to be employed in conjunction with a television receiver proper, the combination of switching means for conditioning the receiver selectively for U. H. F. or V. H. F. operation or quiescence, a receptacle into which the receiver power cord is plugged, and on-off switching means ganged with the first-mentioned switching means for cutting out this receptacle when the receiver is quiescent and coupling this receptacle to the household power supply when the receiver is conditioned either for U. H. F. operation or for V. H. F. operation.

The functions of the ganged switches 27 and 28, manually operated by shaft 10 (Fig. 3) are to couple a V. H. F. antenna (not shown) to the signal output terminals 121 and 122 when the converter switches 27 and 28 are set to the V. H. F. position, but to couple the signal output of transformer 111 to the output terminals 121 and 122 when the switches 27 and 28 are set in the U. H. F. position. Additional functions are to short out the V. H. F. antenna when the ganged switches are in the "off" and U. H. F. positions, and also to de-energize primary 129 when the switches are in the "off" and V. H. F. positions. Accordingly, there are provided a pair of V. H. F. antenna terminals 160 and 161 disposed on a strip 170 (Figs. 4 and 5). Terminal 160 is connected by a conductor 162 (Fig. 3) to contact 163 of switch 27, and terminal 161 is connected by a conductor 164 to contact 165 on switch 28. Contact 166 of switch 27 is grounded in order to connect V. H. F. antenna terminal 160 to ground when the ganged switches are in the "off" position illustrated in Fig. 5. Contact 167 of switch 28 is likewise connected to ground in order to ground V. H. F. antenna terminal 161 when the ganged switches are in the "off" position. Switch 27 includes a moving contact 168 which performs the following functions: (1) closes terminal 160 to ground when the switches are in the "off" position; (2) closes V. H. F. antenna terminal 160 to output terminal 121, through contact 169 of switch 27 and conductor 171, when the ganged switches are in the V. H. F. position; (3) closes grounded contact 119 and one side of transformer secondary 118 to output terminal 121, through contacts 119 and 169 and conductor 171, when the switches are in the U. H. F. position. Switch 27 also has a moving contact 172 which closes V. H. F. antenna terminal 160 to ground, through contacts 163 and 166, when the switches 27 and 28 are in the U. H. F. position.

Referring now to switch 28, it has a movable contact 173 which performs the following functions: (1) connecting V. H. F. antenna terminal 161 to ground through contacts 165 and 167 when the switches are in the "off" position; (2) closing V. H. F. antenna terminal 161 to output terminal 122 when the switches are in the V. H. F. position, through contact 174 and conductor 175; (3) connecting the other side of secondary 118, through contacts 120 and 174 and conductor 175, to output contact 122 when the switches are in the U. H. F. position.

Switch 28 also includes a moving contact 176 which grounds V. H. F. antenna terminal 161 when the switches are in the U. H. F. position. Switch 28 further includes a contact 177 which connects contacts 132 and 138 to energize primary 129 when the switches are in the U. H. F. position, permitting the primary 129 to be open-circuited when the ganged switches are in the "off" and V. H. F. positions.

Figure 6:
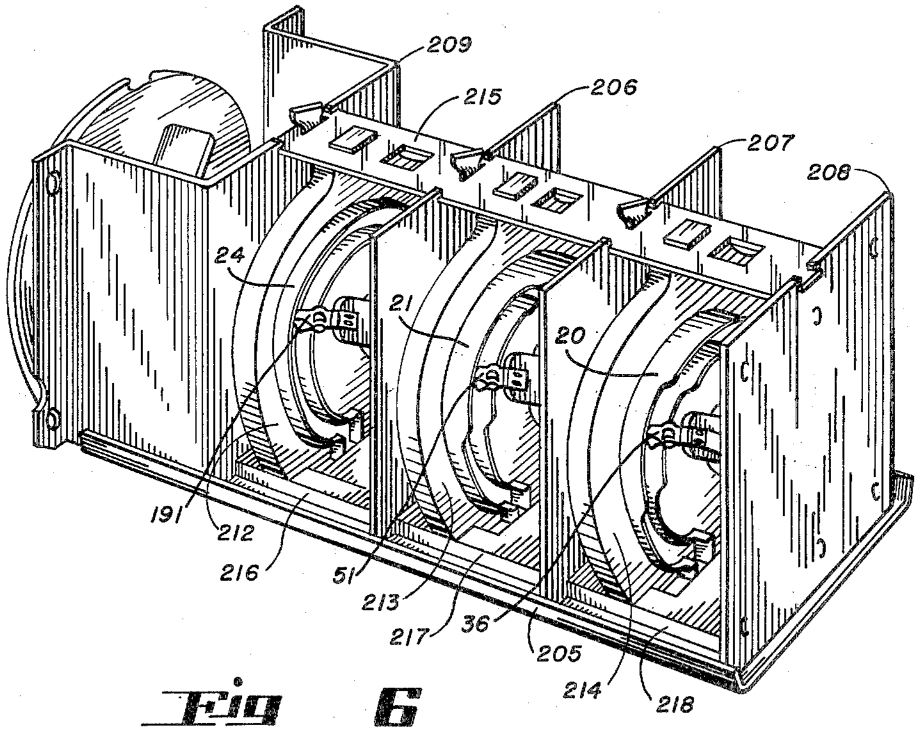
Fig. 6 is a perspective view of the novel ganged adjusting mechanism with which the converter is tuned.

Having described our converter construction in detail, the description of the operation proceeds. The novel antenna coupling circuit is symbolically illustrated in Fig. 14 and represented by equivalent circuits in Figs. 10 and 15. This circuit (Fig. 14) comprises a transformer having a primary 34 (Figs. 1, 14) and a secondary 40 (Figs. 3, 9, 14), a tuning line 20, a fixed capacitor 39 (Figs. 3, 9, 14), an adjustable end inductance 37 (Figs. 3, 9, 14), and an adjustable trimmer capacitor 38. The elements 39, 40, 20, 37, and 38 are serially arranged in a closed loop. The antenna coupling transformer consists of the primary loop 34 and the secondary plate 40, these elements being small, rigid conductors positioned relative to each other with close tolerance by a molded piece 190 (Fig. 9) of mica-filled phenolic or other suitable insulating material such as glass, for example. The low potential terminals of capacitors 39 and 38 are grounded to the chassis at 45 and 44 (Figs. 1, 3, 14). The tuning line 20 and shorting bar 36 are illustrated in Fig. 6. The closed end of the tuning line is grounded at 41 (Fig. 14).

Referring to the simplified equivalent circuit for the antenna coupling system shown in Fig. 15, the primary circuit comprises effective shunt capacitance and the self-inductance of the primary winding or loop 34, while a tuned effectively parallel resonant circuit is provided by the tuning line 20 and the elements 37, 38, and 39, these last three elements being included in the secondary circuit in order to compensate for normal production variations in the system.

Referring to Fig. 15, which is somewhat over-simplified in that it is representative of conditions occurring at one frequency, it will be seen that the primary circuit is broadly tuned. The secondary circuit is sharply tuned to the desired channel by the position of shorting bar 36. The shorting bars are symbolically illustrated in Fig. 5, and the illustration in that figure is not intended to show mechanical details. The same considerations are applicable to Figs. 14, 17, and 18 so far as the shorting bars are concerned. As best shown in Fig. 6, these shorting bars are in fact mechanical contacts individually disposed on the ends of insulating arms.

The secondary circuit is both capacitively and magnetically coupled to the primary circuit, capacitance being provided by the elements 34 and 40 and the dielectric therebetween, mutual inductive coupling being provided by the interlinking of the primary and secondary circuits occasioned by the close spacing between the elements 34 and 40.

Antenna coupling circuit alignment adjustments are provided as follows:

First, end inductance 37 (Figs. 3, 5, 9, 14) is made of a stiff but bendable conductive material, so that its loop configuration can be predetermined at the factory;

Second, capacitor 38 (Figs. 3, 5, 9, 14) is adjusted at the factory in conventional manner by a screw 192 (Fig. 1). The operator tunes the antenna coupling circuit to the desired channel by turning member 194 (Fig. 3), thereby determining the position of shorting bar 36 on tuning line 20 (Figs. 6, 14).

It has been shown that the ideal coefficient of coupling in a tunable band pass filter of the general character under consideration, utilizing lumped reactances and assuming over-coupling, would vary approximately as a linear function of the resonant frequency to which the filter is tuned in order to maintain an acceptably constant pass band. Those skilled in the art are aware that extreme difficulty is encountered in making the coefficient of coupling behave in this manner or in approaching such behavior. So far as we are aware, the present antenna input circuit represents the first provision of an antenna input circuit utilizing a tuning line in which the coefficient of coupling is controlled automatically to vary in such a manner as to maintain the pass band with commercially acceptable constancy It has further been shown, utilizing the notation of Terman and lump-constant circuit elements, that $$m=\frac{LC_1}{C_1+C_2}+\frac{M_2}{\left(\frac{\omega}{\omega_2}\right)^2-1}+\frac{LC_1}{C_1+C_2\left[\left(\frac{\omega}{\omega_2}\right)^2-1\right]}$$

where $L$=inductance of tuned secondary.

$L_2$=primary coil inductance, $C_1$=capacitance of coupling capacitor, $C_2$=capacity across input terminals, $M_2$=mutual inductance between L and $L_2$, $\omega_2$=resonant frequency of primary circuit, $\omega$=operating frequency (dependent on adjustment of L and C).

The notation in this equation is that of Terman, pages 166, 167, Fig. 30 (*b*), Radio Engineers Handbook, McGraw-Hill, New York, 1943.

The first term on the right-hand side of this equation, $C_1$ and $C_2$ being constant, shows that a component of $m$ is a linear function of L and therefore varies inversely as the square of the operating frequency. This component, considered alone, would decrease $m$ at an excessively rapid rate, narrowing the pass band at higher operating frequencies.

The second term on the right-hand side of this equation, $M_2$ being constant, has a negative value when $\omega$ is low compared to $\omega_2$, and a positive value when $\omega$ is high compared to $\omega_2$, showing that another component of $m$ tends to loosen the coupling and narrow the band width at low operating frequencies but to tighten the coupling and widen the pass band at higher frequencies. $\omega_2$ approximates 650 megacycles in the preferred embodiment.

The total coupling is limited by primary loading of equivalent resistance R approximating 150 ohms.

The third term varies from a negative value at low frequencies to a smaller positive value at high frequencies, but its effect is relatively insignificant.

The first two terms, taken together, provide values of effective coupling, $m$, throughout the operating range from 465 to 905 megacycles, which preserve an adequate band width.

Both first and second terms are frequency-dependent, but the effect of the second term is to slow down the rate at which $m$ would otherwise decrease with operating frequency increase, thereby preserving the desired band width.

It can also be shown that $$\omega_2^2=\frac{1}{L_2(C_1+C_2)(1-K_2^2)}$$

where $K_2$ is the coupling coefficient corresponding to $M_2$, the mutual inductance between L and $L_2$.

We make $\omega_2$ approximately equal to 650 megacycles when the secondary is tuned to the geometric mean of the range between 465 and 905 megacycles. It is essentially a fixed parameter, although it varies slightly with secondary tuning.

It will be appreciated that the term $\omega$ is functionally dependent on the capacitance in shunt with the secondary and also the inductance of the secondary, these parameters varying in a known manner as the tuning line length is adjusted by the short-circuiting bar 36.

An alternative circuit equivalent is illustrated in Fig. 10.

The closed end of tuning line 20 is ground at 41 and the shorting bar is grounded at 42 in order to prevent the line from functioning as a radiator of oscillator voltages and also to permit the use of a relatively short tuning line.

The section of the tuning line 20 between shorting bar 36 and its closed end, together with the ground connections 41 and 42, is utilized in a particularly advantageous manner to reduce radiated oscillator voltage. So far as driving of the antenna by such voltages is concerned, the Q of the antenna circuit in radically decreased by the loading provided by this normally unused portion of the transmission line, which loading is equivalent to that which would theoretically be provided by two heavily loaded circuits coupled to the source of such voltages. Additionally, these ground connections and the normally unused portion of the line load the end of the line and permit the use of lines having a length of considerably less than a quarter wave length.

The novel preselector circuit is symbolically illustrated in Fig. 17 and represented by equivalent circuits in Figs. 11 and 13. It comprises tuning lines 20 and 21 (Figs. 5, 6, 17). Tuning line 21 is provided with a shorting bar 51 as best shown in Fig. 6, and the closed end of the line is grounded at 52 (Fig. 5). Connected in series between one terminal 53 (Fig. 9) of the tuning line and ground 54 (Fig. 1) are an adjustable end inductor 47 (Fig. 9) and an adjustable trimmer capacitor 48 (Figs. 3, 9). Connected in series between the other terminal of the tuning line and ground are a fixed capacitor 46 (Figs. 3, 9) and a parallel combination of a fixed capacitor 49 and a fixed inductance 50 (Fig. 1). Said other tuning line terminal is also connected to a metallic plate 19 (Figs. 3, 9, 17). The preselector circuit (Fig. 17) also comprises tuning line 20, adjustable end inductance 37, trimmer capacitor 38, and fixed capacitor 39, hereinabove described in detail.

Metallic plates 40 and 19 (Figs. 3, 9, 17) constitute a capacitor for coupling one of the tuning line circuits to the other. End inductance 47 (Figs. 3, 9), like inductance 37, is adjusted by bending. Capacitor 48 (Fig. 9) is adjusted by a screw 195 (Fig. 1). The capacitance provided by plates 19, 40 is adjusted by screw 196 (Fig. 9).

Again the ideal coefficient of coupling in a preselector circuit of the general character herein considered, would vary approximately as a linear function of the resonant frequency to which the preselector is tuned in order to maintain an acceptably constant pass band. So far as we are aware, the present preselector circuit is fundamentally novel and represents the first utilization of two tuning lines and means intercoupling them in such a way that the coefficient of coupling is controlled automatically to vary in such a manner as to maintain a commercially workable pass band. It has been shown by analogous reasoning, utilizing lumped parameters, that the effective coupling $$m=\frac{LC_1}{(C_1+C_2)}+\frac{\frac{LC_1}{(C_1+C_2)}}{\left(\frac{\omega}{\omega_2}\right)^2-1}$$

and that $$\omega_2^2=\frac{1}{L_2(C_1+C_2)}$$

when L is a secondary self-inductance, $C_1$ is the coupling capacitance, $C_2$ is the primary circuit capacitance, $L_2$ is the primary circuit self-inductance, and C is the secondary circuit capacitance. Referring now to the first of these equations, the first term represents a component of coupling which decreases at an excessively rapid rate with increase in operating frequency, thereby tending to narrow the pass band at the upper end of the tuning range. On the other hand, the second term on the right-hand side of the first equation represents a component of coupling which is negative and tends to broaden the pass band when $\omega$ is low with respect to $\omega_2$, but is positive and tends to tighten the coupling when $\omega$ is high with respect to $\omega_2$, $\omega$ representing the operating frequency and $\omega_2$ representing the resonant frequency of the primary circuit. The circuits are so arranged that $\omega$ is greater than $\omega_2$, whereby the fraction $$\frac{\omega}{\omega_2}$$

decreases with increasing frequency. The significance of this is that the component of coupling which tends to tighten the coupling increases with increasing frequency, the denominator in the second term on the right-hand side of the equation approaching zero as the frequencies are increased. $\omega_2$ is therefore established higher than $\omega$. The coupling is adjusted at the factory for the desired maximum band width at a frequency of 700 megacycles, for example. The above-discussed second term together with the first term, provides values of effective coupling, *m*, throughout the operating range from 465 to 905 megacycles, thereby preserving an adequate band width. Both first and second terms of the equation are frequency-dependent, but the effect of the second term is to slow down the rate at which *m* would otherwise decrease with operating frequency increase, thereby preserving the desired band width. The term $\omega$ is functionally dependent on the inductance and capacitance of the secondary, these parameters varying in known manner as the tuning line length is adjusted by the short-circuiting bar 51, bars 51 and 36 being ganged for unicontrol.

An alternative circuit equivalent is illustrated in Fig. 13.

Coming now to a description of the method by which this converter is aligned, a metering circuit comprising a rectifier and a high-gain oscilloscope is inserted between points 55 and 81 (Fig. 5), and the crystal 22 is open-circuited. Converter power is turned off, and the tuning shaft (Fig. 6) is turned to the maximum clockwise or highest frequency position, the pointer on the tuning dial (not shown) then being set against a limit stop located slightly to the right of the channel 82 calibration (Fig. 2) on the dial. Next the dial is set at 700 megacycles, and there is fed to the antenna terminals 29, 30 (Fig. 5) a high output sweep signal of 685 to 715 megacycles. Trimmer capacitors 38 and 48 (Fig. 5) are then adjusted to maximum oscilloscope deflection, and capacitor 19, 40 (Fig. 5) is adjusted until the oscilloscope pass band pattern "flat tops." The dial is then set at 470 megacycles, and a 400 cycle amplitude modulated signal on a 470 megacycle carrier is applied to the antenna input terminals 29, 30 (Fig. 5). Capacitors 38 and 48 are again adjusted to maximum oscilloscope deflection. Finally the dial is set at 890 megacycles, and a 400 cycle amplitude modulated signal on an 890 megacycle carrier is applied to the U. H. F. antenna input terminals 29, 30, whereupon the end inductors 37 and 47 are adjusted for maximum oscilloscope deflection. The foregoing steps are repeated if necessary. The dial is again set to 700 megacycles and, using a sweep signal of 685 to 715 megacycles, the capacitor 19, 40 is again adjusted until the oscilloscope pass band "flat tops."

The oscillator is now adjusted, power is turned on, and the dial set at the maximum clockwise position. Inductance 58 is then adjusted until the oscillator frequency is 775 megacycles, utilizing an insulated alignment tool. Opening the end inductor 58 lowers the oscillator frequency, and closing it increases that frequency. Finally the dial is set to the maximum counterclockwise position and capacitor 61, 62 (Fig. 5) is adjusted until the oscillator frequency is 338 megacycles. An oscillator frequency range from 338 to 775 megacycles is appropriate for a converter output signal frequency approximating 127 megacycles.

The converter is connected to a Crosley continuous tuner, adjusted to 127 megacycles, and the converter is turned on. By the use of a traveling detector and band pass indicator, the over-all pass band of the converter is peaked at 124 and 130 megacycles by adjustment of the core of transformer 111 (Fig. 5), the core of transformer 84, and trimmer capacitor 156. The connections to the Crosley receiver having a Crosley continuous tuner are made with a 300 ohm twin transmission line. Crosley tuners of the type suitable for use in conjunction with this converter, as indicated by the block marked 200 in Fig. 5, are shown in the following patents of Emmery J. H. Bussard, assigned to the same assignee as the present application and invention (to wit, AVCO Manufacturing Corporation):

U. S. Patent 2,652,487, "Constant Band Width Coupling Circuit for Television Receiver Tuners";

U. S. Patent 2,615,983, "Tuner for Television Receivers";

U. S. Patent 2,579,789, "Tuner for Television Receivers"; and

U. S. Patent 2,711,477, "Tuner for Television Receivers."

The oscillator generates local oscillations within the frequency range from 338 to 775 megacycles, for a converter output frequency centered at 127 megacycles. The oscillator circuit is illustrated in Fig. 18 and the bridge equivalent in Fig. 19. Connected between the symmetrical anode leads of triode 23 and the symmetrical grid leads of that tube are a series combination of a first capacitor 63 (Figs. 3, 9, 18), tuning line 24 (Fig. 6), fixed capacitor 59 (Figs. 3, 9, 18), and adjustable end inductance 58 (Figs. 3, 9, 18), the latter comprising a bendable strip of conductive material. The elements 63, 24, 59, and 58 are equivalent to the two arms $L_1$, $C_1$ and $L_2$, $C_2$ of the bridge network shown in Fig. 19. The tuning line is adjustably short-circuited by a shorting bar 191, the mechanical detail of which is shown in Fig. 6, this element 191 being only symbolically illustrated in Fig. 18. The shorting bar 191, like the other shorting bars, consists of a contact mounted on the end of a suitably insulated arm. The shorting bar is ganged for unicontrol with the preselector shorting bars or contacts. The closed end of the line is connected to ground through a parallel combination of resistor 74 and capacitor 75 (Fig. 18), to provide the parameters R and C represented in Fig. 19. The remaining arms of the bridge are provided by the grid-cathode interelectrode capacitance $C_G$ and the plate-cathode interelectrode capacitance $C_P$ of tube 23, as represented in Fig. 19. A grid resistor 64 (Figs. 3, 9, 18) is connected between grid and ground, and the anode is connected to the positive power supply line (+B) through a filter network comprising series resistor 70 (Figs. 3, 9, 18), shunt capacitance 72, and series dropping resistor 71 (Figs. 3, 18). In this manner the parameters $R_G$ and $R_P$ (Fig. 19) are effectively provided.

In series between the cathode and ground is a choke 69 (Figs. 3, 9, 18) shown as $L_K$ in Fig. 19. One terminal of the heater is grounded and the other heater terminal is connected to the ungrounded filament current supply line through a filter comprising: first, a parallel combination including the choke 68 and resistor 76, and second, a shunt capacitor 78 (Figs. 3, 9, 18). In parallel with the cathode inductance $L_K$ is the series combination of the heater-cathode capacitance $C_{HK}$, the heater resistance $R_H$, and the heater inductance $L_H$.

The circulating current in the oscillator tank circuit, consisting of the reactance arms of the bridge between grid and plate, produces out-of-phase potentials, required to sustain oscillations, at grid and plate. The cathode is tapped in near a null point of the bridge so that the reaction of the cathode and heater circuits on the oscillator tank circuit is minimized. The cathode inductance $L_K$ and heater inductance $L_H$ are resonated by the heater-cathode capacitance of the tube at approximately 700 megacycles. Mixer excitation is derived by coupling through the heater-cathode capacitance, one terminal of the heater being placed in circuit with the crystal mixer 22 by a resistor 67 and a capacitor 73 (Figs. 3, 5, 9).

The preselector circuit coupled to the mixer and the mixer itself have a minimum reaction on the oscillator tank circuit, this desirable result being obtained by taking the oscillator voltage from the heater circuit. The excitation voltage is taken across the parameters $R_H$ and $L_H$, which are representative of the heater resistance, the heater self-inductance, and the self-inductance of the choke 68.

To provide for factory adjustment, trimmer capacitor 61, 62 (Figs. 9, 18) is connected between the anode of tube 23 (Figs. 5, 18) and terminal 60 of tuning line 24. As indicated in Fig. 9, capacitor 61, 62 is adjusted by a screw 201. This adjustment compensates for variations in tube capacitances and circuit capacitances arising in quantity production.

The oscillator injection is relatively uniform across the band. The reaction of the heater inductance increases with frequency and tends to increase the output as the transit-time loading of the input circuit increases. This action compensates for the general tendency toward reduction in oscillator output voltage caused by the decrease in effective $R_G$ at higher frequencies.

As will be seen from an inspection of Fig. 19, this oscillator effectively has plate and grid tank circuits. One of the parameters intercoupling these tank circuits is the plate-grid interelectrode capacitance of tube 23, referred to as $C_{PG}$. Another is the variable capacitor 61, 62. A third is the cathode choke 69 indicated as $L_K$ in Fig. 19. This choke is, of course, a magnetic coupling parameter. It functions to change the feedback ratio as operating frequency is increased, to compensate for transit-time delay effects which increase with increasing frequency. As these effects tend to attenuate the local oscillation output, the feedback ratio is changed to increase the drive on the input of the oscillator tube and to maintain with reasonable consistency the amplitude of the local oscillator output signals.

This oscillator circuit has excellent stability characteristics. In production we minimize oscillator drift by the location of parts, by the use of negative temperature coefficient capacitors 63, 75, 59 and by thermal isolation of the oscillator elements from the heat of tubes 25 and 26.

We have taken full advantage of the symmetrical anode and grid leads of tube 23 and the increase in operating frequency made possible by symmetrical leads and connections in the following manner: As clearly shown by the disposition of the elements 58 and 63 in Figs. 9 and 18, we effectively couple a single tuning line 24 into the central points of symmetry of the plate and grid of tube 23, thereby realizing many of the advantages which would otherwise have to be achieved by the provision of two tuning lines in lieu of the single open-wire line 24 which this invention exploits.

The converter or frequency changing stage exploits a germanium crystal mixer 22. Carrier signal input to the mixer is provided by a connection from junction point 55 (of capacitor 49 and inductor 50) to the cathode of the crystal (Figs. 1, 5). In most installations the polarity of the crystal is immaterial. The combination 49, 50, considered alone, is desirably resonant at approximately 310 megacycles. This combination serves two useful purposes: (1) It attenuates oscillator voltages tending to radiate from the antenna, because it serves as an effective short circuit to such voltages, looking from the oscillator into the terminals 55, 54 (Fig. 5); (2) The signal coupling into the mixer provided by the preselector and this parallel capacitor 49-inductor 50 combination varies automatically with preselector tuning in such a manner as to compensate for the normal decrease in gain which accompanies an increase in signal frequency. The elements 49 and 50 are preferably designed, in conjunction with the preselector, for maximum power transfer of the carrier signals to the mixer. These elements terminate tuning line 21 in such a manner as to provide a proper coupling to a diode mixer. Local oscillation injection into the mixer stage is provided by capacitor 73 and resistor 67, in series with the anode of crystal 22 and the oscillator tube heater (Figs. 1, 3, and 5), i. e., between junction points 66 and 81. Between point 66 and ground is a series circuit comprising: a parallel combination of inductor 68 and resistor 76, and a capacitor 78 (Figs. 3, 5).

The mixer and associated circuit elements accomplish in a novel manner the basic functions required of a frequency converter stage in a superheterodyne receiver, to wit: First, the beating of the local oscillator frequency against the input carrier frequency to produce the desired difference frequency output; second, the presentation of a low input impedance to intermediate frequencies; third, the presentation of a high input impedance at the mixer to R. F. carrier frequencies and local oscillations; fourth, the rejection of sum frequencies and input frequency components in the mixer output system; fifth, the rejection of image frequencies and undesired carrier frequencies preparatory to application of signals to the mixer.

In the present invention considerable image frequency rejection and very effective selection of the carrier frequency signals in the desired channel are accomplished before application of carrier signals to the mixer, as indicated above. The mixer input circuit, including resonant line 21, is essentially a selective network tuned to the desired carrier signal channel. This network comprises the parameters $L_1$ and $C_1$ (Fig. 20) provided by the resonant line 21, the series capacitors 46 and 48 (Figs. 5 and 20), and the combination of parallel capacitance 49 and inductance 50 (Fig. 20). By reason of the adjustment of shorting bar 51 to select the desired channel, the entire network comprising capacitors 46, 49, 48, $C_1$, and inductors $L_1$ and 50 is tuned to the carrier signal frequency. This entire network may be reduced to a simple parallel resonant circuit, comprising lumped inductance and capacitance, which presents a high impedance to the carrier frequency signals, thereby applying them strongly to the crystal mixer 22. It will be borne in mind that the carrier frequency signals are effectively applied across the combination $L_1$ and $C_1$ shown in Fig. 20. On the other hand, the oscillator excitation voltage is injected into the crystal at junction point 81 (Fig. 20). The network comprising the elements $L_1$, $C_1$, 46, 48, 49, and 50 "looks like" a large net capacitive reactance to oscillator voltages, again recalling that the local oscillation frequency is lower than the corresponding selected channel frequency. It will be seen, therefore, that the crystal mixer excitation circuit "looks like" a relatively high impedance to both radio frequency carrier and oscillator output signals. On the other hand, this network "looks like" a very low impedance to input signals of frequencies on the order of the first intermediate frequency and strongly attenuates or discriminates against such input signals of that frequency so far as application to the crystal is concerned, the total impedance to the first intermediate frequency signals being in effect provided by the relatively low inductive reactance 50 so far as the input circuit is concerned. This low impedance presented to intermediate frequency signals improves the already excellent intermediate frequency rejection provided by the preselector circuits. The selection of the desired first intermediate frequency signals in the mixer output circuit is primarily provided by the circuit (resonant at 127.5 megacycles) comprising the primary of transformer 84 and capacitor 17 (Figs. 5 and 20). The output shunt load comprising the elements 73, 67, 68, 76, and 78 is designed to be of a relatively high impedance with respect to output voltages impressed across the primary of transformer 84. This load is essentially resistive and serves to control the Q of the I. F. coupling network. It will be observed that the mixer is effectively tapped down on the preselector circuit to prevent unduly large loading, by reason of the connection of the mixer and capacitor 17 across capacitor 49 only of the voltage divider comprising capacitors 46, 49, and 48. The capacitors 46 and 48 accordingly prevent unduly large loading of the mixer by the preselector. Capacitor 48 effectively isolates the high impedance end of the preselector from ground, thereby facilitating tuning through the upper portion of the range. The combination of capacitance 49 and inductance 50, as stated above, must resonate below the low frequency end of the range and preferably at 310 megacycles. Inductance 50 also serves as a direct current return for the crystal current. The capacitors 46, 49, and 48 also provide some tuning capacity which constitutes the means for loading of the preselector by the mixer. Neither of the terminals of line 21 can be directly grounded without introducing undesired discontinuities into the tuning characteristic of the converter, and grounding of such a terminal would cause the shorting bar to have little or no effect on the resonant frequency at the upper end of the range. This condition is eliminated by the provision of the capacitors 46, 48, and 49.

At a given crystal excitation power, the crystal presents one impedance to the carrier frequency circuit and another to the intermediate frequency circuit. With conventional methods of oscillator coupling, the oscillator injection and hence the crystal excitation power would vary over wide limits. We provide a novel oscillator injection circuit which minimizes mismatch and improves mixer performance. Uniform oscillator injection not only minimizes mismatch, but it generally improves the efficiency of mixer performance. One of the major advantages of the crystal mixer is the possibility of supplying a lower excitation power for efficient mixer operation, decreasing oscillator radiation from the antenna.

As indicated above, the excitation voltage from oscillator to mixer is taken off at the oscillator heater socket clip 66 (Fig. 9) so that the load reflected into the oscillator tank circuit by the mixer and associated circuits is in balanced relationship with respect to the feedback bridge network (Fig. 19) in the oscillator. Thus the mixer and preselector circuits have a minimum reaction on the oscillator, and uniform mixer excitation, oscillator range, and oscillator stability are promoted. It will not be appreciated by those skilled in the art that a minimum of oscillator tank circuit loading is achieved by driving the mixer from a voltage developed in the common leg of the feedback bridge network in the oscillator.

Coupled to the mixer output is a low noise stage of power amplification which amplifies between low impedance circuits. This stage compensates for losses in the crystal mixer and provides the correct matching impedance for coupling to the signal input circuit of the V. H. F. receiver. This stage comprises a twin triode tube 25 connected as a grounded-cathode-input, grounded-grid-output stage, with heater circuit neutralization. The high potential terminal of transformer 84 is directly connected to control grid 87 of the first triode section (Fig. 5) for maximum power transfer and minimum noise. Between cathode 89 and ground is connected a parallel combination of a resistor 91 and a capacitor 92 (Figs. 3, 5). The anode 100 of the first section is directly connected to the cathode 101 of the second section for maximum energy transfer. The control electrode 104 of the second section is grounded for high-frequency currents by a capacitor 105 (Figs. 3, 5). A grid resistor 103 is connected between the cathode 101 and control electrode 104 of the second triode section. The anode 108 is connected to the space current source (+B) through the primary of transformer 111 and choke 113 (Fig. 3). The primary is damped by a resistor 157 (Fig. 3), and a filter capacitor 116 is connected between the junction of elements 113, 157, and ground. The primary inductance of transformer 84 and capacitor 17 are slug tuned to 127.5 megacycles.

Magnetically coupled to the primary of the output transformer 111 is a secondary 118, capacitance tuned by a parallel combination of a fixed capacitor 155 and a trimmer capacitor 156 (Fig. 5). The primary of the output transformer 111 is slug tuned to resonate with its distributed capacity at 127.5 megacycles. The secondary is capacitively tuned to 127.5 megacycles. These two tuned circuits provide further selectivity together with high to low impedance transformation. The secondary terminals are separately connected to grounded contact 119 of switch 27 and contact 120 of switch 28 (Figs. 5, 7, 8). When the switches 27 and 28 are set to the U. H. F. position, the secondary is connected through the switch contacts to signal output terminals 121 and 122 (Figs. 4, 5). The maximum response of the output transformer circuit is centered at 127.5 megacycles, the first intermediate frequency, providing further rejection and attenuation of undesired signals. The output transformer also provides matching to the 300 ohm input of a V. H. F. receiver. The signal output of this converter is reactively coupled to a continuously tuned V. H. F. receiver of the type mentioned above in order to improve the noise figure.

The inter-element capacity of the output of the input section of tube 25 is resonated out by a heater circuit choke arrangement to provide resistive coupling between the tube sections and neutralization.

The input triode section of tube 25 is neutralized by novel circuitry comprising a bifilar heater choke 93 (Fig. 3) having windings 94, 95, winding 94 being connected between one heater terminal and ground and winding 95 (Fig. 5) being in circuit between the other heater terminal and the filament supply terminal 97. A bypass capacitor 99 (Figs. 3, 5) is connected between terminal 97 and ground.

The heater chokes 94, 95 ($L_H$) are adjusted to resonate with the plate-to-ground capacitance parameters at a frequency of approximately 127.5 megacycles, those parameters comprising (Fig. 21):

$C_{PK}$, the plate-cathode capacitance of the input section;
$C_{K_1GND}$, the cathode-ground capacitance of the input section;
$C_{K_1H}$, the cathode-heater capacitance of the input section;
$C_{K_2H}$, the cathode-heater capacitance of the output section;
$C_{K_2GND}$, the cathode-ground capacitance of the output section;
$C_{K_2G_2}$, the cathode-grid capacitance of the output section.

The cathode-ground capacitance $C_{K_1GND}$ (primarily capacitor 92, Fig. 5) and the cathode resistor $R_{K_1}$ (91, Fig. 5) provide a tap point for voltage feedback of the correct phase to the grid circuit for neutralization.

In Fig. 6 and the foregoing description we disclose, in a U. H. F. converter for a television receiver, the combination of a plurality of adjustable tuning lines 24, 21, and 20, other circuit elements inclusive of the amplifying tube 25, the local oscillator tube 23, and the frequency-changing mixer 22 for utilizing said tuning lines to convert received U. H. F. carrier frequency signals into first intermediate signals, and continuously movable unicontrol means for varying the electrical lengths of said tuning lines. The unicontrol means is comprised in the mechanism for controlling the operation of the shorting contacts 36, 51, and 191, illustrated in Fig. 6 and hereinabove referred to as "shorting bars." The description now proceeds to discussion of the ganged adjusting mechanism illustrated in Fig. 6, which mechanism includes the continuously movable unicontrol means. This mechanism bears some points of similarity to that illustrated in Figs. 1, 2, 3, 4, 36, and 37 of U. S. Patent No. 2,694,150 to Bussard, entitled "Combined Very-High-Frequency and Ultra-High-Frequency Tuner for Television Receiver," and departs therefrom primarily in the respect that the V. H. F. inductors are omitted in the instant disclosure, and secondarily in that the present invention is a U. H. F. converter. Reference is made to that patent for a complete description of a ganged adjusting mechanism inclusive of a control shaft and tuning lines.

Figure 2:
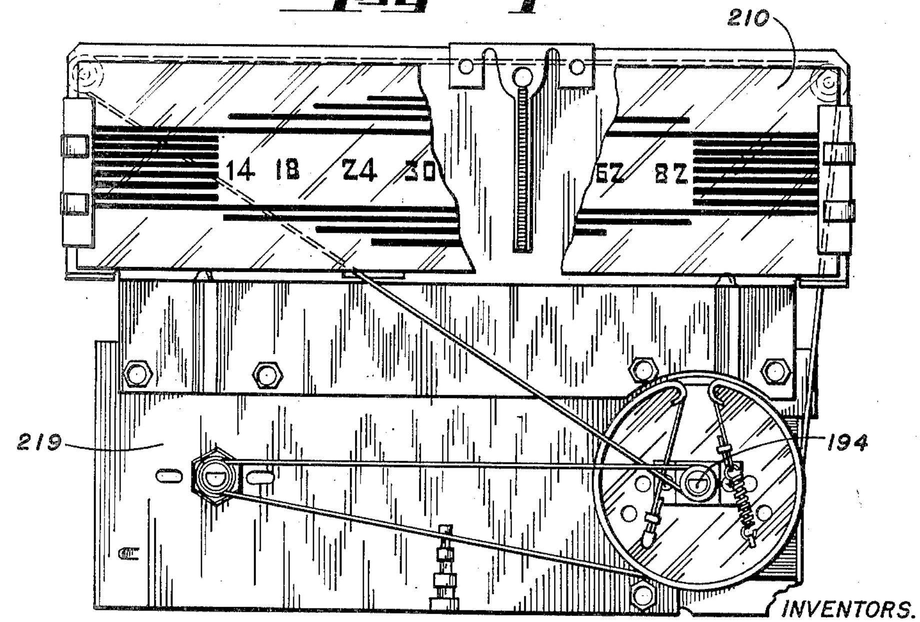
Fig. 2 is a front elevational view of the novel converter.

The supporting framework for the ganged adjusting mechanism illustrated in Fig. 6 is of a well-known conventional construction such as that usually employed with V. H. F. continuous tuners. It is made of magnetic material, such as steel, and it comprises a metallic side member 205 (shown as a base in Fig. 6), metallic partition members 206 and 207 projecting from the base member, and end members 208 and 209, the various framework members all being secured together by appropriate expedients well known to the art and inclusive of a suitable dust cover (shown generally on the right side of Figs. 1 and 3). The framework elements 205, 206, 207, 208, and 209 and the dust cover are heavily plated with a highly conductive material, and they provide electrostatic and electromagnetic shielding. The end member 209 is of a generally U-shaped configuration providing a compartment for the reception of the mechanical limit stop device (not shown) commonly incorporated in continuous tuners to limit shaft rotation. All of the rotating parts of the tuner provided in accordance with the invention are actuated by a common unicontrol shaft which terminates in an extension 194 (Figs. 2 and 3). This shaft is suitably journaled or otherwise supported for rotation in bearings in or attached to the end members 208, 209 of the framework. The shaft is made of a ceramic or other suitable durable insulating material. The frame members 206, 207, 208, and 209 are suitably apertured or formed to receive the control shaft, which projects through or to all of them either directly or by extension. Secured to the end of the control shaft is a metallic extension 194, conventionally provided with a pulley manually actuated by the means and according to the manner disclosed in U. S. Patent No. 2,630,716 to Depweg, entitled "Tuning Mechanism." Reference is made to this patent for a description of the shaft extension 194, tuning dial 210, and the associated elements controlled by the operator to position the unicontrol shaft of the ganged tuning line adjusting mechanism illustrated in Fig. 6. The positions of the shaft extension 194 and the tuning dial 210 are illustrated in Figs. 1, 2, and 3 of the instant drawings.

The framework illustrated in Fig. 6 provides three compartments, in each of which is located a tuning line. The framework provides electrostatic and magnetic shielding between the compartments. Support for the tuning lines is afforded by the dielectric wafers 212, 213, and 214, each of which is centrally apertured to receive the control shaft (not shown herein but disclosed by reference to Bussard Patent No. 2,694,150). The insulating supports 212, 213, and 214 are securely positioned in the framework by the metallic member 215. An inspection of Fig. 6 reveals that the construction and operation of each of the three tuning lines contained in the complete ganged adjusting unit are identical except for matters of design, such as tracking considerations. The lines 20 and 21 are included in the preselector, and the line 24 is included in the oscillator stage, all as described hereinabove in detail. Each of the shorting contacts 36, 51, and 191 is carried by an insulating arm suitably mounted for rotation on the unicontrol shaft. Each tuning line comprises a pair of conductive metallic ribbons placed on one side of its dielectric wafer support. The insulating dielectric bases 216, 217, and 218 are suitably formed for the reception of the terminals of the transmission lines and for the security of the ensemble on metallic member 205, which, as shown in Fig. 9, is preferably vertically oriented in perpendicularity to the front and rear portions of the chassis in abutment with the right end wall of the R. F. subchassis shown in Fig. 12.

As shown in Fig. 12, a depression indicated by the arrow 220 is formed in the main chassis member to provide support and shielding for the elements illustrated in Fig. 9 and certain of the elements illustrated in Fig. 1, as described above.

While we do not desire to be limited to a single set of circuit parameters, the following illustrative parameters have been found to be satisfactory in one successful embodiment of the invention:

| | |
|---|---|
| Resistor **149** | 820 ohms. |
| Resistor **153** | 820 ohms. |
| Resistor **157** | 27,000 ohms. |
| Resistor **103** | 10,000 ohms. |
| Resistor **64** | 10,000 ohms. |
| Resistor **70** | 1,800 ohms. |
| Resistor **91** | 220 ohms. |
| Resistor **67** | 180 ohms. |
| Resistor **70** | 1,800 ohms. |
| Resistor **71** | 5,600 ohms. |
| Resistor **76** | 330 ohms. |
| Resistor **74** | 1,000 ohms. |
| Tube **23** | Type 6AF4. |
| Tube **26** | Type 6X4. |
| Tube **25** | Type 6BQ7. |
| Mixer **22** | Type 1N72. |
| Capacitor **39** | 1.5 micromicrofarads. |
| Capacitor **38** | .8–6.5 micromicrofarads, variable. |
| Capacitor **19** | .1–.5 micromicrofarad, variable. |
| Capacitors **34**, **40** | 1.5 micromicrofarads. |
| Capacitor **46** | 2.2 micromicrofarads. |

| | |
|---|---|
| Capacitor **48** | .8–6.5 micromicrofarads, variable. |
| Capacitor **49** | 5 micromicrofarads. |
| Capacitor **59** | 6 micromicrofarads. |
| Capacitor **61** | .1–1.5 micromicrofarads, variable. |
| Capacitor **63** | 12 micromicrofarads. |
| Capacitor **17** | 1.0 micromicrofarad. |
| Capacitor **72** | 470 micromicrofarads. |
| Capacitor **73** | 2.2 micromicrofarads. |
| Capacitor **92** | 4.7 micromicrofarads. |
| Capacitor **78** | 470 micromicrofarads. |
| Capacitor **105** | 1500 micromicrofarads. |
| Capacitor **99** | 1500 micromicrofarads. |
| Capacitor **116** | 1500 micromicrofarads. |
| Capacitor **155** | 150 micromicrofarads. |
| Capacitor **114** | 20 microfarads. |
| Capacitor **151** | 20 microfarads. |
| Capacitor **156** | 20–100 microfarads, variable. |
| Capacitor **154** | 16 microfarads. |
| Inductance **37** | .002–.0045 microhenry self-inductance, variable. |
| Inductance **47** | .002–.0045 microhenry self-inductance, variable. |
| Inductance **58** | .001–.0025 microhenry self-inductance, variable. |
| Inductance **50** | .05 microhenry self-inductance. |
| Inductance **69** | .96 microhenry self-inductance. |
| Inductance **84** | .162 to .238 microhenry self-inductance. |
| Inductance **94** | .095 microhenry self-inductance. |
| Inductance **95** | .095 microhenry self-inductance. |
| Inductance **68** | .9 microhenry self-inductance. |
| Oscillator tuner: | |
| Distributed capacitance | 3.5 micromicrofarads, maximum. |
| Maximum inductance | .07445 microhenry. |
| Minimum inductance | .033 microhenry. |
| Preselector tuners: | |
| Distributed capacitance: | |
| Mixer | 2.0 micromicrofarads. |
| Antenna | 1.7 micromicrofarads. |
| Maximum inductance: | |
| Mixer | .0654 microhenry. |
| Antenna | .0606 microhenry. |
| Minimum inductance: | |
| Mixer | .0314 microhenry. |
| Antenna | .0323 microhenry. |
| Oscillator range | 338 to 775 megacycles. |
| Converter range | 465 to 902 megacycles. |
| First intermediate frequency | 127.5 megacycles. |
| Over-all gain of converter | 1.2–2.0 |
| Voltages: | |
| Plate, tube **23** | 100 volts. |
| Plate of output section, tube **25** | 225 volts. |
| Cathode of input section, tube **25** | 2.0 volts. |
| Resonance frequencies: | |
| Elements **49, 50** | 310 megacycles. |
| Primary of output transformer | 123 megacycles. |
| Secondary of output transformer | 131 megacycles. |
| Input impedance of V. H. F. receiver. | 150 ohms, approximately. |
| Impedance of U. H. F. antenna. | 150 ohms, approximately. |

The whole converter unit is placed in an attractive cabinet (not shown) containing a U. H. F. antenna connected to terminals 29, 30.

While there has been shown and described what is at present considered to be the preferred embodiment of the invention, it will be understood by those skilled in the art that various modifications and changes and substitutions of equivalents may be made therein within the true scope of the invention as defined by the appended claims.

Having fully disclosed and described our invention, we claim:

1. In an oscillator-frequency changer combination of the type including a frequency changer of the diode type and an oscillator tube having a heater, means for injecting oscillator voltages into said frequency changer comprising a ground connection for one terminal of said heater and coupling means between the other terminal of said heater and said frequency changer, said coupling means comprising a series combination of a resistor and a capacitor.

2. Injection means in accordance with claim 1 and including a cathode choke in parallel with a series combination of heater inductance and cathode-heater capacitance.

3. The combination of an oscillator having a vacuum tube including a heater, a frequency changer, and means comprising a series combination of resistance and capacitance for directly coupling said heater to said frequency changer to inject oscillations into said frequency changer.

4. A crystal mixer circuit comprising a diode crystal mixer connected between an input circuit and an output circuit, means in series with said crystal for injecting local oscillator voltages into said crystal, said output circuit consisting of a shunt arm of parallel inductance and capacitance resonated at the desired intermediate frequency, said input circuit consisting of a first shunt arm of parallel inductance and capacitance resonant at approximately 310 megacycles and a second shunt arm consisting of a series combination of a tuning line and two fixed capacitors, said input circuit being adjusted to select the carrier frequency signals applied to said mixer.

5. A converter unit for a television receiver comprising antenna and oscillator and mixer circuits and means for tuning the oscillator and antenna circuits, in which said means includes: a curved parallel conductor tuning line for each of the oscillator and antenna circuits, each line having a closed end and comprising an outer conductive ribbon and a concentric inner conductive ribbon of smaller diameter, means comprising wafers disposed in parallel for supporting said tuning lines, each wafer having secured thereto the edges of two ribbons constituting a tuning line, a rotatable shorting bar for adjusting the electrical length of each line, and means for unicontrolling the shorting bars—the antenna circuit of such converter unit comprising: a coupling loop constituting the primary of an input transformer and having terminals for connection to an antenna, frequency-determining elements associated with the antenna tuning line and consisting of a first capacitor, a coupling plate comprising the secondary of said input transformer, a lumped inductor, and a second capacitor, said coupling plate being connected between said first capacitor and one conductor of said tuning line, and said lumped inductor being connected between said second capacitor and the other conductor of said tuning line.

References Cited in the file of this patent

UNITED STATES PATENTS

| | | |
|---|---|---|
| 2,021,692 | Lewis | Nov. 19, 1935 |
| 2,039,634 | Clay | May 5, 1936 |
| 2,141,756 | Linsell | Dec. 27, 1938 |
| 2,266,670 | Winfield | Dec. 16, 1941 |
| 2,282,861 | Gardiner | May 12, 1942 |
| 2,314,309 | Hobbs | Mar. 16, 1943 |
| 2,383,322 | Koch | Aug. 21, 1945 |
| 2,431,333 | Labin | Nov. 25, 1947 |
| 2,439,245 | Dunn | Apr. 6, 1948 |
| 2,451,291 | Koch | Oct. 12, 1948 |
| 2,452,916 | Fleischmann | Nov. 2, 1948 |
| 2,480,340 | Rose | Aug. 30, 1949 |
| 2,482,393 | Wilburn | Sept. 20, 1949 |
| 2,504,603 | Storm | Apr. 18, 1950 |
| 2,533,020 | Knol et al. | Dec. 5, 1950 |
| 2,542,915 | Favre | Feb. 20, 1951 |
| 2,543,973 | Jensen | Mar. 6, 1951 |
| 2,576,836 | Hilsinger | Nov. 27, 1951 |

(Other references on following page)

UNITED STATES PATENTS

| | | |
|---|---|---|
| 2,598,857 | Sziklai | June 3, 1952 |
| 2,608,649 | Magnuski | Aug. 26, 1952 |
| 2,627,579 | Wasmansdorff | Feb. 3, 1953 |
| 2,631,241 | Schmidt | Mar. 10, 1953 |
| 2,656,517 | Johnson | Oct. 20, 1953 |
| 2,665,377 | Krepps | Jan. 5, 1954 |

OTHER REFERENCES

"Some Design Considerations of Ultra-High-Frequency Converters," by Pan RCA Review, September 1950, pp. 377 to 398, vol. 11.

"U. H. F.-Converter Design Features," by Tele-tech, September 1951, pp. 37, 38, 63 and 64.